United States Patent
Ball

(10) Patent No.: US 8,159,284 B2
(45) Date of Patent: Apr. 17, 2012

(54) METHOD FOR REGULATING TEMPERATURE AND CIRCUIT THEREFOR

(75) Inventor: Alan R. Ball, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/968,675

(22) Filed: Dec. 15, 2010

(65) Prior Publication Data

US 2011/0080207 A1 Apr. 7, 2011

Related U.S. Application Data

(60) Continuation-in-part of application No. 12/397,444, filed on Mar. 4, 2009, which is a division of application No. 11/171,018, filed on Jul. 1, 2005, now Pat. No. 7,521,985.

(51) Int. Cl.
*H01L 37/00* (2006.01)

(52) U.S. Cl. ......... 327/513; 327/512; 327/543; 327/538

(58) Field of Classification Search .................. 327/512, 327/513
See application file for complete search history.

(56) References Cited

U.S. PATENT DOCUMENTS

| | | | | |
|---|---|---|---|---|
| 5,302,889 A * | 4/1994 | Marsh | ........................... | 323/284 |
| 6,205,010 B1 * | 3/2001 | Ohsaka et al. | ................ | 361/103 |
| 6,363,490 B1 * | 3/2002 | Senyk | ........................... | 713/300 |
| 6,803,803 B1 * | 10/2004 | Starr et al. | ..................... | 327/378 |
| 7,012,459 B2 * | 3/2006 | Sutherland | ..................... | 327/513 |
| 7,214,910 B2 * | 5/2007 | Chen et al. | ..................... | 219/494 |
| 7,696,794 B2 * | 4/2010 | Feldtkeller | ..................... | 327/137 |
| 7,768,339 B2 * | 8/2010 | Suzuki | ........................... | 327/513 |
| 2002/0105373 A1* | 8/2002 | Sudo | ............................. | 327/538 |
| 2003/0006829 A1* | 1/2003 | Alessandria et al. | ......... | 327/538 |

\* cited by examiner

*Primary Examiner* — Ryan Jager
(74) *Attorney, Agent, or Firm* — Rennie William Dover

(57) ABSTRACT

A method and circuit for managing thermal performance of an integrated circuit. In accordance with an embodiment, a thermal limit circuit and a semiconductor device are manufactured from a semiconductor material, wherein the thermal limit circuit is configured to operate at a temperature level that is different from a threshold temperature in response to the thermal sensing element sensing a temperature at least equal to the threshold temperature.

23 Claims, 2 Drawing Sheets

US 8,159,284 B2

METHOD FOR REGULATING TEMPERATURE AND CIRCUIT THEREFOR

The present application is a continuation-in-part of parent U.S. patent application Ser. No. 12/397,444 filed on Mar. 4, 2009, by Alan R. Ball et al., titled "METHOD FOR REGULATING TEMPERATURE," having publication number US 2009/0160528 A1, and publication date of Jun. 25, 2009, which is a divisional application of parent U.S. patent application Ser. No. 11/171,018, filed on Jul. 1, 2005, now U.S. Pat. No. 7,521,985 B2, all of which are hereby incorporated by reference, and priority thereto for common subject matter is hereby claimed.

BACKGROUND

The present invention relates, in general, to electronics and, more particularly, to methods of forming semiconductor devices and structure.

High power semiconductor components typically include circuitry to protect them from thermal failure. For example, an integrated voltage regulator that dissipates a large amount of heat often includes a thermal shutdown circuit that shuts down or turns off the integrated circuit when the temperature reaches a critical level. Once the substrate cools down, the thermal shutdown circuit turns the voltage regulator back on. A drawback with including thermal shutdown circuits is that they completely remove power from their load and cause the system to shut down.

Another common way to protect power Metal Oxide Semiconductor Field Effect Transistors (MOSFETs) against thermal failure is to decrease the current conducted through them by coupling together a plurality of output devices in parallel. For example, a plurality of insulated gate field effect transistors can be configured to have their drain terminals coupled to each other, their gate terminals coupled to each other, and their source terminals coupled to each other. In this configuration, the output current is shared by several insulated gate field effect transistors such that the total output current is the sum of the currents flowing through each insulated gate field effect transistor. A drawback with this approach is that differences in their on-resistance ($R_{dson}$) may lead to an imbalance in the currents that flow through each insulated gate field effect transistor causing one or more of the field effect transistors to overheat and suffer thermal failure. Integrated circuit manufacturers have included active circuits that measure the current flowing in the parallel connected insulated gate field effect transistors to overcome this problem. In this configuration, the gate terminals are not connected to each other but are coupled to receive independent control signals. A control circuit uses the measured current to adjust the gate drive of the individual insulated gate field effect transistors to maintain substantially the same current in each insulated gate field effect transistor. Drawbacks with this approach include the need for complicated circuitry to monitor the current flowing through each insulated gate field effect transistor and the complexity of the interconnections to route the data to the control circuit.

Accordingly, it would be advantageous to have methods and circuits that lower the operating temperature of a transistor and that maintain current conduction through the transistor. It would be advantageous for the methods and circuits to be cost efficient.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
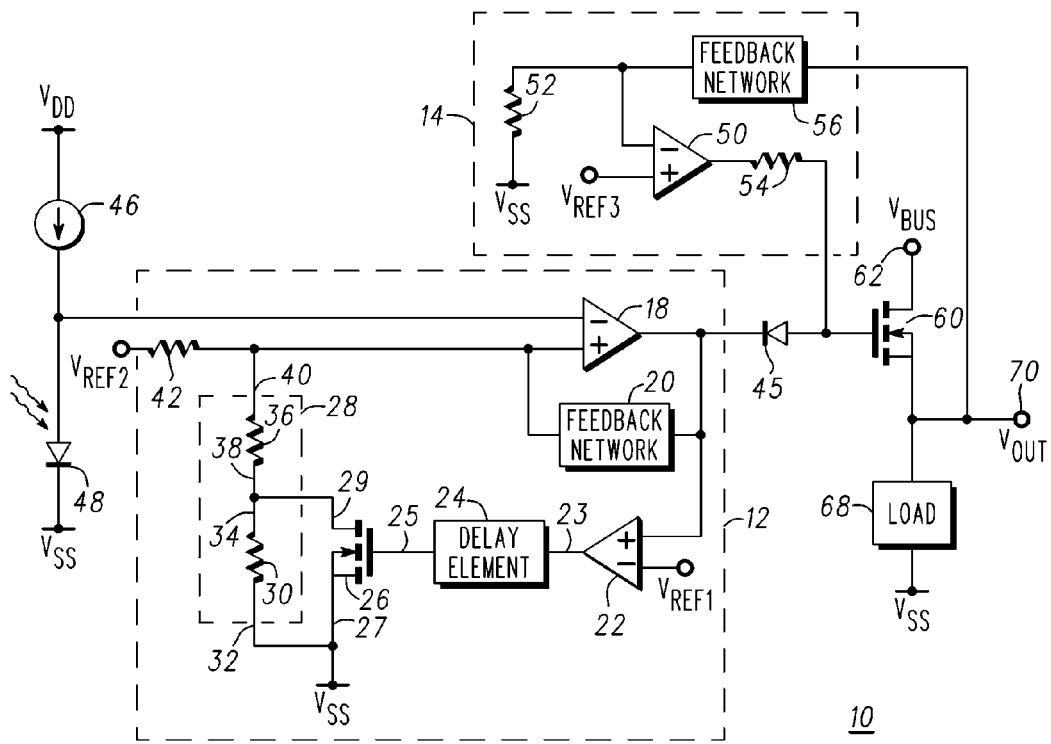
FIG. 1 is a circuit schematic of an integrated circuit in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage and that the voltage level of a logic zero voltage is a function of the power supply voltage and the type of logic family. For example, in a Complementary Metal Oxide Semiconductor (CMOS) logic family a logic low voltage may be thirty percent of the power supply voltage level. In a five volt Translator-Translator Logic (TTL) system a logic low voltage level may be about 0.8 volts, whereas for a five volt CMOS system, the logic zero voltage level may be about 1.5 volts. A logic one voltage level ($V_H$) is also referred to as a logic high voltage level and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

Generally, the present invention provides methods and circuitry for performing thermal management of devices manufactured from a semiconductor material including integrated circuits, power MOSFETs with internal temperature sense circuitry, and the like. In accordance with an embodiment of the present invention, the integrated circuit comprises one or more power semiconductor devices such as, for example, one or more power Field Effect Transistors (FETs). Each power FET is connected to a thermal limit circuit and a signal regulator. The thermal limit circuit may be referred to as a linear thermal limit circuit or a temperature regulator. The signal regulator may be a voltage regulator, a current regulator, or the like. The thermal limit circuit operates in an idle or standby mode in response to heat generated by the power FET being sufficiently low that the temperature of the semiconductor material is below a predetermined value or level. The predetermined temperature value or level is also referred to as a predefined temperature, a threshold temperature value or level, or a threshold value or level. In response to at least one power FET generating sufficient heat to raise the temperature of the semiconductor material to the threshold level, the thermal limit circuit enters an active mode and the signal regulator enters the standby mode. The active operating mode of the thermal limit circuit is also referred to as a temperature mode. In the active mode or temperature mode, the thermal limit circuit generates a drive signal for the power FET that maintains a drain-to-source current flowing through the power FET but at a level that is substantially constant and below its level when the power FET operates in its normal operating mode, i.e., in response to the signal regulator operating in the active mode and the thermal limit circuit operating in the standby mode.

In accordance with an embodiment of the present invention and in response to the temperature of the semiconductor device or the temperature sensed by a thermal sensing element equaling or exceeding a threshold temperature, the thermal limit circuit is configured to operate in the active or temperature mode and generates a gate drive signal that results in the power FET having a constant current that is less than a nominal operating current. Accordingly, the thermal limit circuit is configured to operate at a temperature level that is substantially constant and less than the threshold temperature.

In accordance with an embodiment of the present invention and in response to the temperature equaling or exceeding a threshold level, the thermal limit circuit operates in the active or temperature mode and generates a gate drive signal that results in the power FET having an oscillating drain-to-source current. Accordingly, the thermal limit circuit is configured to operate at a temperature that oscillates through a range of temperatures, i.e., the operating temperature of the thermal limit circuit is variable, wherein the average temperature of the range is less than the threshold temperature. The lower temperature level of the oscillating temperature is below the threshold level and the upper temperature level may be below, above, or equal to the threshold level.

FIG. 1 is a circuit schematic of an integrated circuit 10 that includes a thermal limit circuit 12 and a signal regulator 14 coupled to a semiconductor device 60 in accordance with an embodiment of the present invention. Thermal limit circuit 12 includes a thermal regulator amplifier 18 connected to a thermal hysteresis comparator 22, a delay element 24, a voltage adjustment element 26, and a voltage divider network 28. More particularly, thermal regulator amplifier 18 has an inverting input terminal, a noninverting input terminal, and an output terminal, wherein the output terminal of thermal regulator amplifier 18 is connected to its inverting input terminal by a feedback network 20. Thus, thermal regulator amplifier 18 is connected in a negative feedback configuration.

Thermal hysteresis comparator 22 has a noninverting input terminal connected to the output terminal of thermal regulator amplifier 18 and an inverting input terminal coupled for receiving a reference voltage $V_{REF1}$. The output terminal of thermal hysteresis comparator 22 is connected to voltage adjustment element 26 through a delay element 24. By way of example, voltage adjustment element 26 is a field effect transistor having a control terminal and current carrying electrodes 27 and 29. The control terminal of field effect transistor 26 is connected to an output terminal 25 of delay element 24, current carrying electrode 27 is coupled for receiving a source of operating potential such as, for example, $V_{SS}$, and current carrying electrode 29 is connected to voltage divider network 28. By way of example, voltage divider network 28 is comprised of a resistor 30 having terminals 32 and 34 and a resistor 36 having terminals 38 and 40 and voltage or potential $V_{SS}$ is at ground. Terminal 32 of resistor 30 may be coupled for receiving a source of operating potential such as, for example, $V_{SS}$, and terminal 34 is commonly connected to current carrying electrode 29 of field effect transistor 26 and to terminal 38 of resistor 36. Terminal 40 of resistor 36 is commonly connected to the inverting input terminal of thermal regulator amplifier 18, feedback network 20, and for receiving a reference voltage $V_{REF2}$ through a resistor 42. Hysteresis comparator 22, delay element 24, transistor 26, and voltage divider network 28 are configured to adjust the voltage at the noninverting input terminal of thermal regulator amplifier 18 and form a reference voltage adjustment circuit.

A diode 45 having an anode terminal and a cathode terminal is commonly connected to the output terminal of thermal regulator amplifier 18 and to the noninverting input terminal of thermal hysteresis comparator 22. More particularly, the cathode terminal of diode 45 is commonly connected to the output terminal of thermal regulator amplifier 18 and to the noninverting input terminal of thermal hysteresis comparator 22.

The thermal limit circuit further includes a current source 46 connected between the noninverting input terminal of thermal regulator amplifier 18 and a source of operating potential $V_{DD}$, and a temperature sensing diode 48 is connected between the inverting input terminal of thermal regulator amplifier 18 and a source of operating potential such as, for example, $V_{SS}$. It should be noted that thermal sensing diode 48 is thermally coupled to transistor 60 and may be positioned to be close to the semiconductor device from which it is sensing the temperature. Thus, thermal sensing diode 48 may be positioned close to transistor 60 so that it can sense the heat generated by transistor 60. In accordance with embodiments in which transistor 60 is a power Field Effect Transistor (FET) temperature sensing diode 48 may be placed on the semiconductor die or chip from which the power FET is fabricated.

In accordance with an embodiment of the present invention, signal regulator 14 is a voltage regulator comprising an error amplifier 50 having a noninverting input terminal coupled for receiving a reference voltage $V_{REF3}$, an inverting input terminal coupled to a source of operating potential such as, for example, $V_{SS}$, through a resistor 52, and an output terminal coupled to the cathode of diode 45 through a resistor 54. A feedback circuit 56 is commonly connected to the inverting input terminal of error amplifier 50 and to resistor 52.

Thermal limit circuit 12 and a signal regulator 14 are connected to transistor 60 which may be, for example, a power field effect transistor. Transistor 60 has a control electrode and current carrying electrodes 62 and 64, wherein the control electrode is connected to the cathode terminal of diode 45, current carrying electrode 62 is connected to a bus line, and current carrying electrode 64 is connected to the inverting input terminal of error amplifier 50 through feedback network 56 and to a load 68. It should be noted that load 68 is connected between current carrying electrode 64 and a source of operating potential such as, for example, $V_{SS}$.

Figure 2:
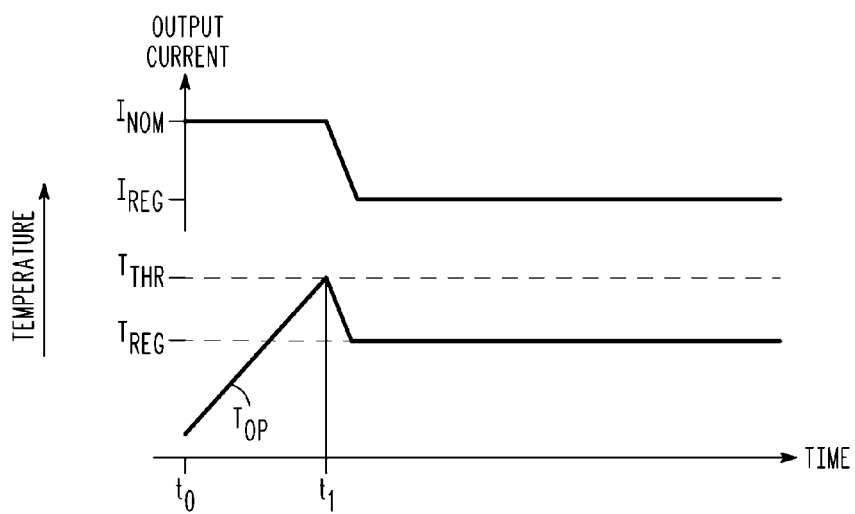
FIG. 2 is a plot of operating parameters versus time for the integrated circuit of FIG. 1.

In operation, thermal limit circuit 12 and signal regulator 14 cooperate to maintain field effect transistor 60 in an operating mode in which its operating temperature is maintained at a level that is below a threshold level $T_{THR}$ in response to the temperature near field effect transistor 60 equaling or exceeding threshold level $T_{THR}$. FIG. 2 is a plot illustrating the temperature sensed by temperature sensing diode 48 versus time. At time $t_0$ to a time just before time $t_1$, the temperature sensed by temperature sensing diode 48 is less than a threshold temperature $T_{THR}$. In response to the temperature sensed by temperature sensing diode 48 being less than threshold temperature $T_{THR}$, transistor 60 operates in a normal operating mode where thermal limit circuit 12 operates in a standby mode, diode 45 is reverse biased, and signal regulator 14 maintains a voltage $V_{OUT}$ at output terminal 70. During this period, output current $I_{OUT}$ is at a nominal level $I_{NOM}$. At time $t_1$, the operating temperature $T_{OP}$ is substantially equal to threshold temperature $T_{THR}$. In response to the operating temperature $T_{OP}$ being equal to threshold temperature $T_{THR}$, thermal limit circuit 12 enters an active mode, which forward biases diode 45 and enables thermal limit circuit 12 to control the voltage at the gate terminal of transistor 60, and signal regulator 14 enters a standby mode to bring the current to level $I_{REG}$ and the operating temperature to temperature $T_{REG}$.

Referring again to FIG. 1, in a normal operating mode error amplifier 50 generates an error signal that controls the gate voltage of field effect transistor 60, which regulates output voltage $V_{OUT}$. In addition, temperature sensing diode 48 is configured such that, in the normal operating mode, the voltage across temperature sensing diode 48 is greater than reference voltage $V_{REF2}$. In response to the voltage across temperature sensing diode 48 being greater than reference voltage $V_{REF2}$, thermal regulator amplifier 18 generates an output signal that is sufficiently high that ORing diode 45 is reverse biased. Accordingly, thermal limit circuit 12 has substantially no impact on the operation of field effect transistor 60. In the standby operating mode, thermal hysteresis comparator 22 is configured to generate a logic low voltage level at output terminal 23. After a delay introduced by delay element 24, the logic high voltage level appears at the control electrode of field effect transistor 26. The logic high voltage appearing at the control electrode of field effect transistor 26 turns it on. A drain-to-source current flows in field effect transistor in the on state. Thus, in the standby operating mode the voltage at the inverting input terminal of thermal regulator amplifier 18 is approximately equal to $(V_{REF2}*(R_{36}))/(R_{36}+R_{42})$ where $R_{36}$ is the resistance value of resistor 36, $R_{42}$ is the resistance value of resistor 42, and voltage source $V_{SS}$ is at ground potential.

In response to the temperature sensed by temperature sensing diode 48 equaling or exceeding threshold temperature $T_{THR}$, the voltage across temperature sensing diode 48 becomes less than the voltage appearing at the inverting input terminal to thermal regulator amplifier 18, and thermal limit circuit 12 enters an active operating mode and signal regulator 14 enters a standby operating mode. As discussed above, the voltage appearing at the inverting input terminal to thermal regulator amplifier 18 is approximately equal to $(V_{REF2}*(R_{36}))/(R_{36}+R_{42})$. Accordingly, thermal regulator amplifier 20 generates an output signal that becomes sufficiently low that ORing diode 45 turns on and reduces the voltage at the gate terminal of field effect transistor 60. In response to the decreased gate voltage, the drain-to-source current of field effect transistor 60 decreases which lowers its operating temperature.

In addition, decreasing the output voltage of thermal regulator amplifier 18 configures the input signals at the inputs of thermal hysteresis comparator 22 such that its output voltage becomes a logic low voltage level. At this transition there is substantially zero delay introduced by delay element 24, thus the logic high voltage level substantially immediately appears at the control electrode of field effect transistor 26. Because of the logic high voltage appearing at its control electrode, field effect transistor 26 is on. In the active operating mode the voltage at the inverting input terminal of thermal regulator amplifier 18 is approximately equal to $(V_{REF2}*(R_{30}+R_{36})/(R_{30}+R_{36}+R_{42})$ where $R_{30}$ is the resistance value of resistor 30, $R_{36}$ is the resistance value of resistor 36, $R_{42}$ is the resistance value of resistor 42, and voltage source $V_{SS}$ is at ground potential. Thus, when thermal limit circuit 12 is in the active operating mode, the voltage at the inverting input terminal of thermal regulator amplifier 18 is greater than it is when thermal limit circuit 12 is in the standby operating mode. In response to the higher reference voltage at the inverting input terminal of thermal regulator amplifier 18, temperature regular 12 adjusts the steady-state thermal regulation point. Delay element 24 maintains the new thermal reference voltage level until thermal limit circuit 12 adjusts to the new thermal regulation point. In accordance with an embodiment of the present invention, the delay time for delay element 24 is at least one thermal time constant of integrated circuit 10. By way of example the delay of delay element 24 is 50 milliseconds.

Decreasing the voltage at the gate of field effect transistor 60 reduces the drain-to-source current which decreases the operating temperature of field effect transistor 60 as illustrated in FIG. 2. In response to the decreased operating temperature, the voltage across temperature sensing diode 48 increases. When the voltage across temperature sensing diode 48 is greater than the voltage at the inverting input terminal of the thermal regulator amplifier 18, thermal regulator amplifier 18 generates an output signal that is sufficiently high that ORing diode 45 is reverse biased. Accordingly, thermal limit circuit 12 enters a standby operating mode and signal regulator 14 enters the normal operating mode.

Figure 3:
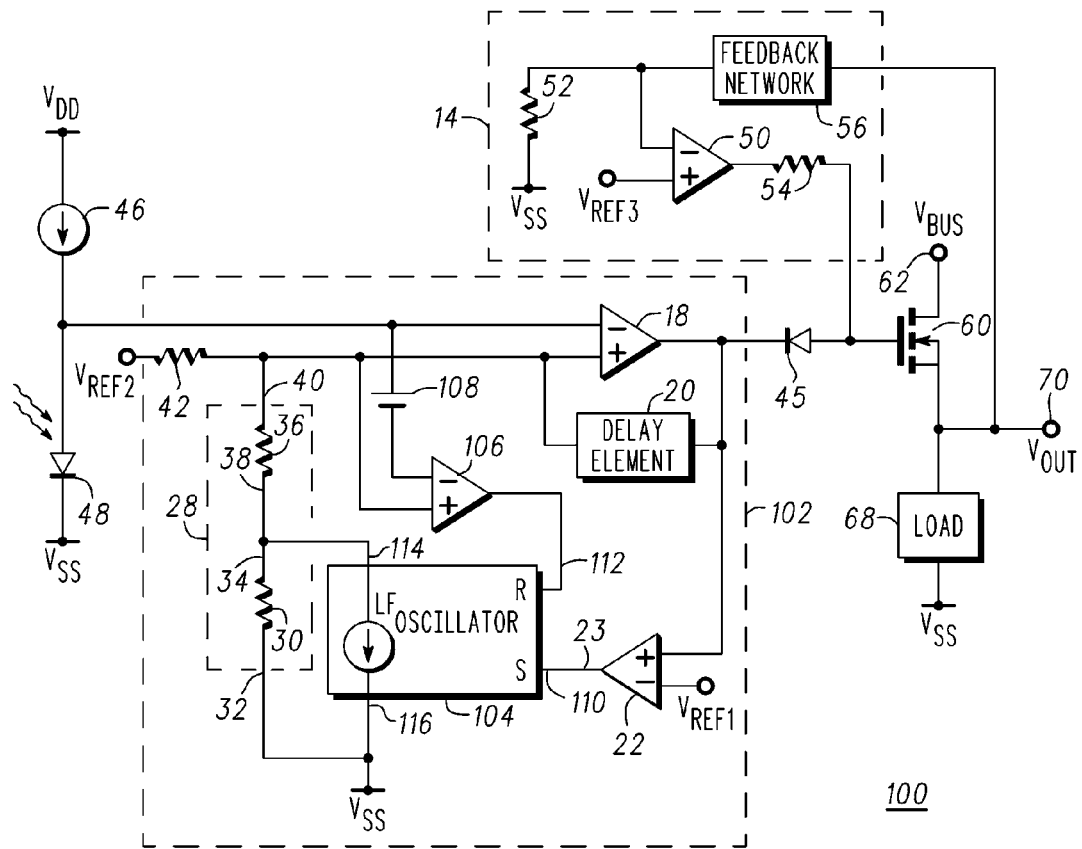
FIG. 3 is a circuit schematic of an integrated circuit in accordance with another embodiment of the present invention.

FIG. 3 is a circuit schematic of an integrated circuit 100 that includes a thermal limit circuit 102 and signal regulator 14 coupled to a semiconductor device 60 in accordance with an embodiment of the present invention. Signal regulator 14 has been described with reference to FIG. 1. Thermal limit circuit 102 is similar to thermal limit circuit 12 except that delay element 24 and field effect transistor 26 are replaced by a low frequency oscillator and RS latch 104, a comparator 106, and a voltage source 108. More particularly, low frequency oscillator and RS latch 104 has input terminals 110 and 112 and output terminals 114 and 116. The output terminal of thermal hysteresis comparator 22 is connected to input terminal 110 of low frequency oscillator and RS latch 104 and output terminal 114 of low frequency oscillator and RS latch 104 is commonly connected to terminals 34 and 38 of resistors 30 and 36, respectively. Output terminal 116 of low frequency oscillator and RS latch 104 is coupled for receiving a source of operating potential such as, for example, $V_{SS}$, which may be at, for example, ground potential. Comparator 106 has an inverting input terminal commonly connected to the inverting input terminal of thermal regulator amplifier 18 and to resistors 36 and 42. The noninverting input terminal of comparator 106 is connected to the noninverting input terminal of thermal regulator 18 through voltage source 108. By way of example, voltage source 108 may be implemented as an offset voltage of comparator 106. The output terminal of comparator 106 is connected to input terminal 112 of low frequency oscillator 104. Hysteresis comparator 22, low frequency oscillator and RS latch 104, voltage divider network 28, comparator 106, and voltage source 108 are configured to adjust the voltage at the noninverting input terminal of thermal regulator amplifier 18 and form a reference voltage adjustment circuit.

Figure 4:
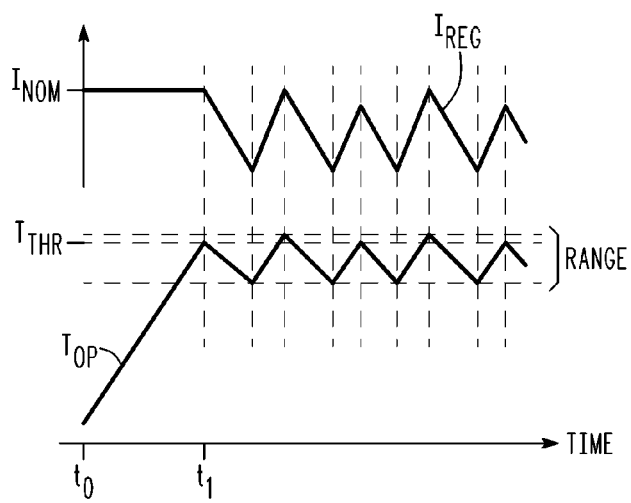
FIG. 4 is a plot of operating parameters versus time for the integrated circuit of FIG. 3.

In operation, thermal limit circuit 102 and signal regulator 14 cooperate to maintain field effect transistor 60 in an operating mode in which its average operating temperature $T_{OP}$ is maintained at a level that is below threshold level $T_{THR}$ in response to the temperature near field effect transistor 60 equaling or exceeding threshold level $T_{THR}$. FIG. 4 is a plot illustrating the temperature sensed by temperature sensing diode 48 versus time. From times $t_0$ to about time $t_1$, the temperature sensed by temperature sensing diode 48 is less than a threshold temperature $T_{THR}$. In response to the temperature sensed by temperature sensing diode 48 being less than threshold temperature $T_{THR}$, transistor 60 operates in a normal operating mode where thermal limit circuit 102 operates in a standby mode and signal regulator 14 maintains a voltage $V_{OUT}$ at output terminal 70. During this period, output current $I_{OUT}$ is at a nominal level $I_{NOM}$. At time $t_1$, the operating temperature $T_{OP}$ is substantially equal to threshold temperature $T_{THR}$. In response to the operating temperature $T_{OP}$ being equal to threshold temperature $T_{THR}$, thermal limit circuit 102 enters an active operating mode and signal regulator 14 enters a standby operating mode.

Referring again to FIG. 3, in a normal operating mode error amplifier 50 generates an error signal that controls the gate voltage of field effect transistor 60, which regulates output voltage $V_{OUT}$. In addition, temperature sensing diode 48 is configured such that, in the normal operating mode, the voltage across temperature sensing diode 48 is greater than reference voltage $V_{REF2}$. In response to the voltage across temperature sensing diode 48 being greater than the reference voltage at the inverting input terminal to thermal regulator amplifier 18, thermal regulator amplifier 18 generates an output signal that is sufficiently high that ORing diode 45 is reverse biased. Accordingly, thermal limit circuit 102 has substantially no impact on the operation of field effect transistor 60. In the standby operating mode, thermal hysteresis comparator 22 is configured to generate a logic low voltage level at output terminal 23. Comparator 106 generates a logic high voltage level at input 112 of low frequency oscillator and RS latch 104. In response to the logic high voltage level that appears at input terminal 112, low frequency oscillator and RS latch 104 is set to sink current from output terminal 114. Thus, in the standby mode of operation the voltage at the inverting input terminal of thermal regulator amplifier 18 is approximately equal to $(V_{REF2}*(R_{36})/(R_{36}+R_{42})$ where $R_{36}$ is the resistance value of resistor 28, $R_{42}$ is the resistance value of resistor 42, and voltage source $V_{SS}$ is at ground potential.

In response to the temperature sensed by temperature sensing diode 48, equaling or exceeding threshold temperature $T_{THR}$, the voltage across temperature sensing diode 48 becomes less than reference voltage $V_{REF2}$, thermal limit circuit 102 enters an active operating mode, and signal regulator 14 enters a standby operating mode. Accordingly, thermal regulator amplifier 20 generates an output signal that becomes sufficiently low that ORing diode 45 turns on and reduces the voltage at the gate terminal of field effect transistor 60. In response to the decreased gate voltage, the drain-to-source current of field effect transistor 60 decreases which lowers the operating temperature of field effect transistor 60.

In addition, decreasing the output voltage of thermal regulator amplifier 18 configures the input signal at the noninverting input terminal of thermal hysteresis comparator 22 such that its output voltage becomes a logic high voltage level, which is transmitted to set input terminal 110 of a latching portion of low frequency oscillator 104. The logic high voltage at set input terminal 110 enables low frequency oscillator 104 which provides a varying reference voltage for the thermal regulation loop to follow. Comparator 106 in cooperation with voltage 108 tracks the input voltage to thermal regulator amplifier 18. The input signal to thermal regulator amplifier 18 follows or is substantially the same as the frequency of oscillator 104 if the frequency of oscillator 104 is set at a level of two thermal time constants or more. In response to temperature sensing diode 48 being more than about 20 millivolts above the thermal reference voltage, (about 10 degrees Celsius), the output of comparator 106 becomes a logic high voltage, causing the output of thermal hysteresis comparator 22 to transition to a logic low voltage level, which resets the latch of low frequency oscillator 104 and places thermal limit circuit 102 in the standby operating mode and signal regulator 14 in the normal operating mode.

FIG. 4 illustrates that decreasing the voltage at the control electrode of field effect transistor 60 so that the gate drive voltage level is reduced and time varying, or oscillatory, generates a drain-to-source current that oscillates and has an average level that is lower than the nominal current level in response to signal regulator 14 operating in the active mode. In response to the decreased oscillating drain-to-source current, the operating temperature also decreases and oscillates, i.e., varies over time. Decreasing the operating temperature, increases the voltage across temperature sensing diode 48. As discussed above, in response to temperature sensing diode 48 being more than about 20 millivolts above the thermal reference voltage, (about 10 degrees Celsius), the output of comparator 106 becomes a logic high voltage, which causes the output of thermal hysteresis comparator 22 to transition to a logic low voltage level and places thermal limit circuit 102 in the standby operating mode.

By now it should be appreciated that circuitry and methods have been provided for performing thermal management in an integrated circuit. Rather than managing temperature constraints by shutting down the power FET, the operating temperature may be held at a constant value below a threshold value or the operating temperature may be made time varying. In these embodiments, the thermal control circuitry may include a thermal limit circuit and a signal regulator and may operate such that in the normal operating mode the signal regulator controls the drain-to-source current of the power FET or in temperature regulation mode the thermal limit circuit controls the drain-to-source current of the power FET.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:
1. An integrated circuit, comprising:
a thermal limit circuit having a thermal sensing element, the thermal limit circuit configured to operate at a temperature level that is different than a threshold temperature in response to the thermal sensing element sensing a temperature at least equal to the threshold temperature, wherein the thermal limit circuit further comprises:

a thermal regulator amplifier having first and second inputs and an output; and a reference voltage adjustment circuit having first and second inputs and at least one output, the first input coupled to the output of the thermal regulator amplifier, the second input coupled for receiving a first reference signal, and the at least one output coupled to the first input of the thermal regulator amplifier;

a signal regulator having an input and an output, the input of the signal regulator coupled to the output of the thermal regulator amplifier; and one or more power transistors coupled to the thermal limit circuit, wherein the thermal sensing element is thermally coupled to the one or more power transistors, and wherein the thermal limit circuit adjusts a current flowing through at least one of the one or more power transistors.

2. The integrated circuit of claim 1, wherein the thermal limit circuit is configured to operate at a temperature level that is less than the threshold temperature.

3. The integrated circuit of claim 2, wherein the thermal limit circuit is configured to operate at a temperature that is substantially constant.

4. The integrated circuit of claim 2, wherein the thermal limit circuit is configured to operate at a temperature that is variable.

5. The integrated circuit of claim 1, wherein the thermal sensing circuit is coupled to the second input of the thermal regulator amplifier, and wherein the integrated circuit comprises.

6. An integrated circuit, comprising:

a thermal limit circuit having an input terminal, an output terminal, and a thermal sensing element, the thermal limit circuit configured to operate at a temperature level that is different than a threshold temperature in response to the thermal sensing element sensing a temperature at least equal to the threshold temperature, wherein the thermal sensing element is coupled to the input terminal;

a signal regulator having an input and an output, the input of the signal regulator coupled to the output terminal of the thermal limit circuit, wherein the thermal limit circuit further comprises:

a thermal regulator amplifier having first and second inputs and an output;

a feedback network coupled between the first input and the output; and a reference voltage adjustment circuit having first and second inputs and an output, the first input coupled to the output of the thermal regulator amplifier, the second input coupled for receiving a first reference signal, and the output coupled to the first input of the thermal regulator amplifier; and a semiconductor device coupled to the thermal limit circuit, wherein the thermal sensing element is thermally coupled to the semiconductor device.

7. The integrated circuit of claim 6, wherein the reference voltage adjustment circuit comprises:

a comparator having first and second inputs and an output, the first and second inputs serving as the first and second inputs of the reference voltage adjustment circuit;

a field effect transistor having a control electrode and first and second current carrying electrodes, the control electrode coupled to the output of the comparator, the first current carrying electrode coupled for receiving a first source of operating potential; and a voltage divider network coupled to the second current carrying electrode of the field effect transistor.

8. The integrated circuit of claim 7, wherein the voltage divider network comprises:

a first resistor having first and second terminals; and a second resistor having first and second terminals, the first terminal of the second resistor coupled to the second terminal of the first resistor and to the second current carrying electrode of the field effect transistor and the second terminal of the first resistor coupled to the second input of the comparator.

9. The integrated circuit of claim 7, further including a delay element coupled between the output of the comparator and the control electrode of the field effect transistor.

10. The integrated circuit of claim 9, wherein the comparator has thermal hysteresis.

11. The integrated circuit of claim 6, wherein the reference voltage adjustment circuit comprises:

a first comparator having first and second inputs and an output, the first and second inputs serving as the first and second inputs of the reference voltage adjustment circuit;

an oscillator having first and second inputs and an output; and a voltage divider network coupled to the output of the oscillator.

12. The integrated circuit of claim 11, further including a second comparator having first and second inputs and an output, the first input coupled to the first input of the thermal regulator amplifier, the second input coupled to the second input of the thermal regulator amplifier, and the output coupled to the second input of the oscillator.

13. The integrated circuit of claim 12, wherein the oscillator is a low frequency oscillator.

14. The integrated circuit of claim 12, wherein the first comparator has thermal hysteresis.

15. The integrated circuit of claim 12, wherein the first input of the second comparator is coupled to the first input of the thermal regulator amplifier through a voltage source.

16. The integrated circuit of claim 6, wherein the output of the thermal regulator amplifier is coupled to the input of the signal regulator through a diode.

17. The integrated circuit of claim 16, wherein a cathode of the diode is coupled to the output of the thermal regulator amplifier and the anode of the diode is coupled to the input of the signal regulator.

18. An integrated circuit, comprising:

a thermal limit circuit having a thermal sensing element configured to operate in a temperature mode in response to the thermal sensing element sensing a temperature at least equal to a threshold temperature, wherein in the temperature mode the average operating temperature of the integrated circuit is less than the threshold temperature in response to the thermal sensing element sensing a temperature at least equal to the threshold temperature, wherein the thermal limit circuit further comprises:

a thermal regulator amplifier having first and second inputs and an output; and a reference voltage adjustment circuit having first and second inputs and at least one output, the first input coupled to the output of the thermal regulator amplifier, the second input coupled for receiving a first reference signal, and the at least one output coupled to the first input of the thermal regulator amplifier;

a signal regulator having an input and an output, the input of the signal regulator coupled to the output of the thermal regulator amplifier; and one or more power transistors coupled to the thermal limit circuit, wherein the thermal sensing element is thermally coupled to the one or more power transistors.

19. The integrated circuit of claim 18, wherein the temperature mode comprises an operating temperature that oscillates.

20. The integrated circuit of claim 18, wherein the temperature mode comprises an operating temperature that is substantially constant.

21. A method for regulating temperature in one or more power transistors, comprising:

sensing temperature in a semiconductor material that includes the one or more power transistors in response to the sensed temperature being less than a reference temperature, operating a thermal limit circuit in a standby mode, wherein a signal regulator maintains a voltage at an output node and a diode coupled to the thermal limit circuit and the signal regulator is reverse biased;

in response to the sensed temperature being at least equal to the reference temperature, forward biasing the diode, and reducing an operating temperature of at least one of the one or more power transistors by adjusting a current flowing through the at least one of the one or more power transistors such that an average operating temperature of the at least one of the one or more power transistors is less than a threshold level.

22. The method of claim 21, wherein reducing the operating temperature of the semiconductor device includes adjusting the operating temperature to be substantially constant.

23. The method of claim 21, wherein reducing the operating temperature of the one or more power transistors includes adjusting the operating temperature to oscillate.

* * * * *